(12) United States Patent
Yoshida et al.

(10) Patent No.: US 10,128,802 B2
(45) Date of Patent: Nov. 13, 2018

(54) SEMICONDUCTOR DEVICE INCLUDING AMPLIFIER

(71) Applicant: MICRON TECHNOLOGY, INC., Boise, ID (US)

(72) Inventors: Kazuhiro Yoshida, Tokyo (JP); Hisayuki Nagamine, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/654,331

(22) Filed: Jul. 19, 2017

(65) Prior Publication Data

US 2017/0317652 A1 Nov. 2, 2017

Related U.S. Application Data

(63) Continuation of application No. 14/708,001, filed on May 8, 2015, now Pat. No. 9,742,361.

(30) Foreign Application Priority Data

May 21, 2014 (JP) ................. 2014-105198

(51) Int. Cl.
*H03F 1/52* (2006.01)
*G11C 7/10* (2006.01)
*G11C 7/02* (2006.01)
*H02H 9/04* (2006.01)
*H01L 27/02* (2006.01)
*G11C 11/4093* (2006.01)
*G11C 11/4074* (2006.01)

(52) U.S. Cl.
CPC ............. *H03F 1/52* (2013.01); *G11C 7/02* (2013.01); *G11C 7/1057* (2013.01); *G11C 7/1084* (2013.01); *G11C 11/4074* (2013.01); *G11C 11/4093* (2013.01); *H01L 27/0255* (2013.01); *H02H 9/04* (2013.01); *G11C 2207/105* (2013.01); *H03F 2200/426* (2013.01)

(58) Field of Classification Search
USPC ............................. 330/252–261, 207 P, 298
See application file for complete search history.

(56) References Cited

U.S. PATENT DOCUMENTS

| | | | |
|---|---|---|---|
| 4,054,910 A | 10/1977 | Chou et al. | |
| 6,208,888 B1 | 3/2001 | Yonce | |
| 7,145,413 B2 | 12/2006 | Hsu et al. | |
| 7,667,542 B2 | 2/2010 | Kasha et al. | |
| 9,742,361 B2 | 8/2017 | Yoshida et al. | |
| 2015/0341001 A1 | 11/2015 | Yoshida et al. | |

FOREIGN PATENT DOCUMENTS

JP 2000-306382 11/2000

*Primary Examiner* — Hieu Nguyen
(74) *Attorney, Agent, or Firm* — Dorsey & Whitney LLP

(57) ABSTRACT

Disclosed here is an apparatus that comprises an amplifier having first and second input nodes, first and second resistors, a first electrostatic discharge protection circuit coupled between the first input node and the first resistor, and a second electrostatic discharge protection circuit coupled between the second input node and the second resistor.

20 Claims, 21 Drawing Sheets

US 10,128,802 B2

SEMICONDUCTOR DEVICE INCLUDING AMPLIFIER

CROSS-REFERENCE TO RELATED APPLICATION(S)

This application is a continuation of U.S. patent application Ser. No. 14/708,001 filed May 8, 2015 and issued as U.S. Pat. No. 9,742,361 on Aug. 22, 2017, which is based upon and claims the benefit of priority from Japanese Patent Application No. 2014-105198 filed on May 21, 2014, the disclosures of which are incorporated herein in their entirely by reference.

BACKGROUND OF THE INVENTION

Field of the Invention

The present invention relates to semiconductor devices and, in particular, to a semiconductor device including a differential-type input circuit.

Description of Related Art

A signal inputted from outside to a semiconductor device is received by an input circuit in the semiconductor device, where an internal signal is generated. The input circuit often includes an amplifier, which includes paired input terminals, as described in FIG. 10 of Japanese Patent Application Laid Open No. 2000-306382. In this case, an input signal is supplied to one input terminal via an external terminal, and a reference voltage is supplied to the other input terminal.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be realized using the teachings of the present invention and that the invention is not limited to the embodiments illustrated for explanatory purposes.

Figure 1:
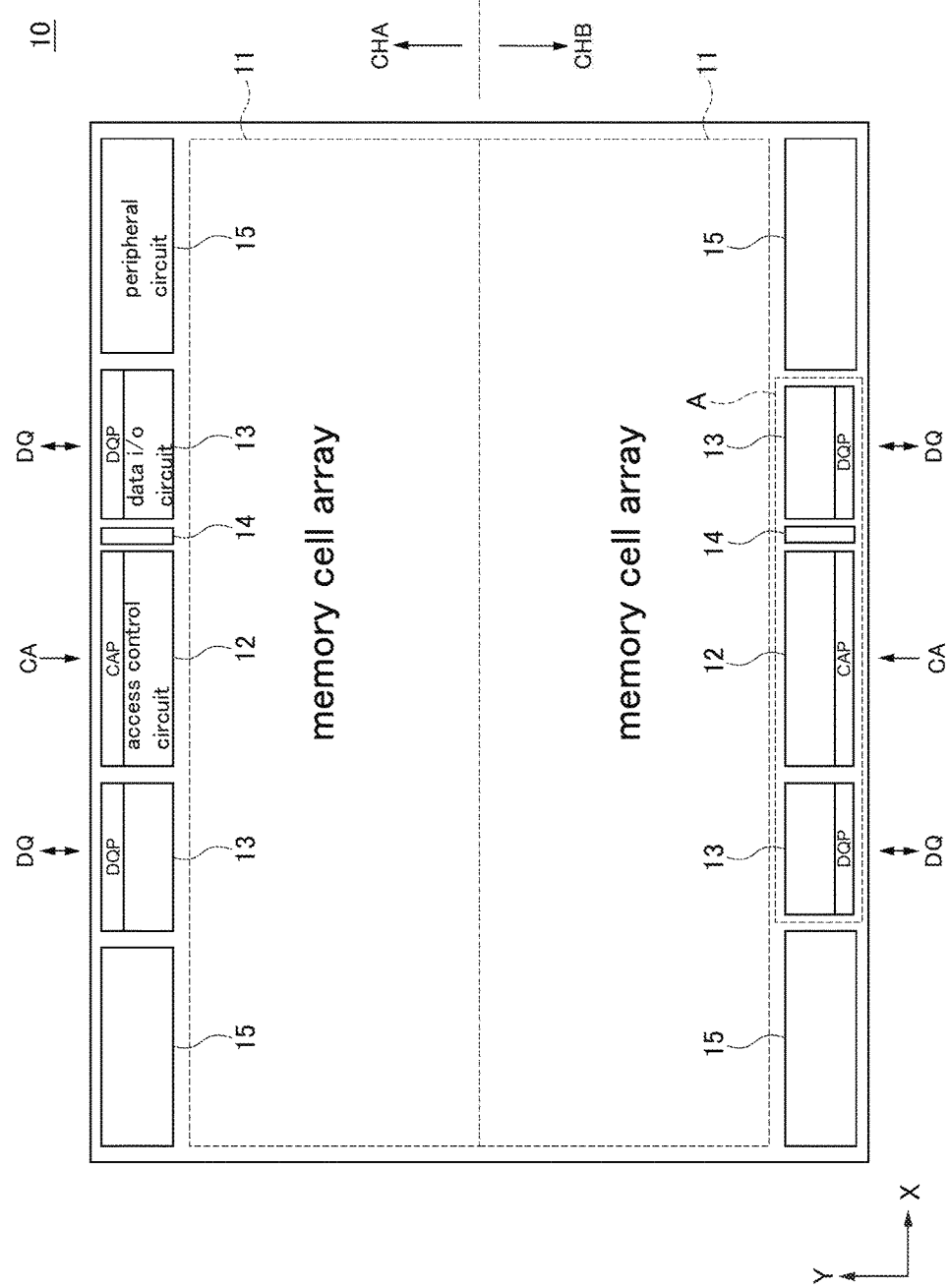
FIG. 1 is a schematic plan view depicting the layout of a semiconductor device according to an embodiment of the present invention.

Referring now to FIG. 1, a semiconductor device 10 according to a first embodiment of the present invention includes two channels CHA, CHB.

FIG. 1 is a schematic plan view depicting the layout of the semiconductor device 10 according to an embodiment of the present invention.

The semiconductor device 10 according to the present embodiment is a DDR4 (Double Data Rate 4)-type DRAM (Dynamic Random Access Memory) integrated on a single silicon substrate. The channels CHA, CHB can be accessed independently from outside, and each of the channels CHA, CHB includes a memory cell array, peripheral circuits, an external terminal, and others. Between the channels CHA, CHB, basically all circuits are separated from each other. However, the present invention is not restricted to a DDR4-type DRAM.

The channels CHA, CHB each include a memory cell array 11, an access control circuit 12, data input/output circuits 13, a reference voltage supply circuit 14, other peripheral circuits 15, a command address terminal CAP, a data input/output terminal DQP, and others.

The memory array cell 11 includes a plurality of memory cells not depicted. The memory cell array 11 is accessed based on a command address signal CA inputted from the command address terminal CAP under the control of the access control circuit 12. Data DQ read from the memory cell array 11 is outputted to the outside via the data input/output terminal DQP under the control of the data input/output circuit 13. Data DQ externally inputted to the data input/output terminal DQP is written in the memory cell array 11 under the control of the data input/output circuit 13.

Figure 2:
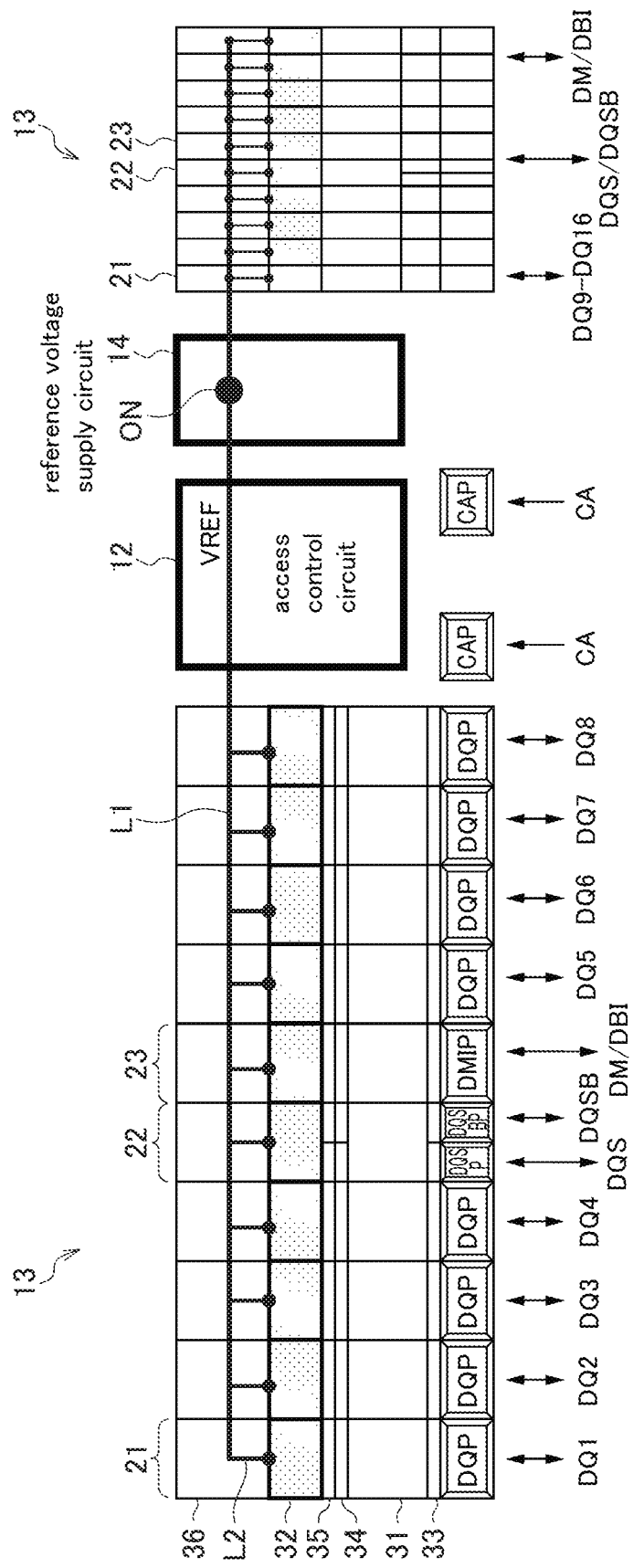
FIG. 2 is a layout diagram depicting a region A in FIG. 1.

FIG. 2 is a layout diagram depicting a region A in FIG. 1 in more detail.

In the semiconductor device 10 according to the present embodiment, data DQ for eight bits is allocated to one data input/output circuit 13. Therefore, one data input/output circuit 13 includes eight data input/output terminals DQP and eight input/output units 21 respectively allocated to these terminals. Furthermore, the data input/output circuit 13 includes an input/output unit 22 allocated to complementary strobe signals DSQ, DSQB and an input/output unit 23 allocated to a data mask signal DM and a data bus inversion signal DBI. The input/output unit 22 is connected to strobe terminals DSQP, DSQBP. Also, the input/output unit 23 is connected to a data mask terminal DMIP. The input/output units 22, 23 basically have a circuit structure similar to that of the input/output unit 21.

The input/output unit 21 includes an output circuit 31, an input circuit 32, an ESD protection diode 33, an input protection resistor 34, an ESD protection diode 35, and a control circuit 36. The control circuit 36 controls the operation of the output circuit 31 and the input circuit 32. The output circuit 31 outputs data DQ to the data input/output terminal DQP and also functions as a termination resistor at the time of ODT (On Die Termination) operation. The input circuit 32 is a receiver which receives data DQ inputted to the data input/output terminal DQP, and includes an amplifier, as will be described further below.

The ESD protection diodes 33, 35 are elements for discharging static electricity applied to the data input/output terminal DQP. The input protection resistor 34 is an element for preventing a large current from flowing through the input circuit 32.

As depicted in FIG. 2, a reference voltage VREF generated by the reference voltage supply circuit 14 is supplied to the input circuit 32. The reference voltage supply circuit 14 has an output terminal ON for outputting the reference voltage VREF, and the output terminal ON is connected to a power supply trunk line L1. The power supply trunk line L1 is a long-distance wire disposed so as to cross many input/output units 21 to 23. Therefore, its parasitic capacitance is relatively large. The power supply trunk line L1 branches near each of the input/output units 21 to 23 and connected to power supply branch lines L2. The power supply branch lines L2 are each connected to the input circuit 32 of each of the input/output units 21 to 23, thereby commonly supplying the reference voltage VREF to each input circuit 32.

Figure 3:
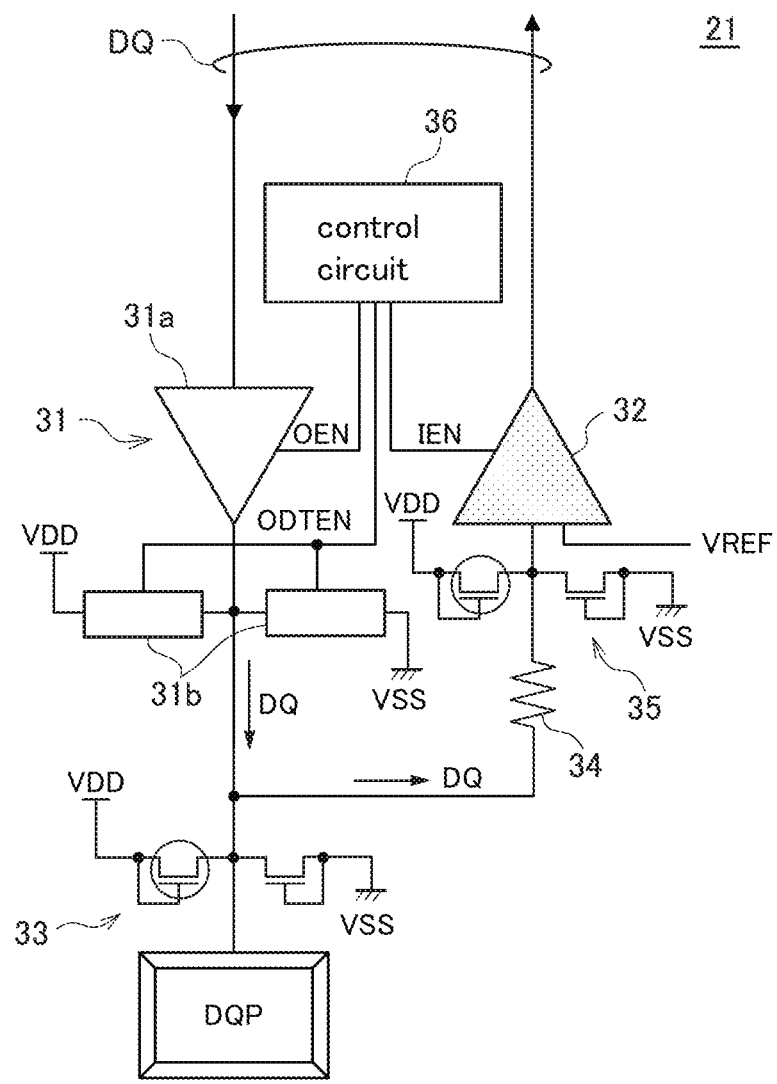
FIG. 3 is a circuit diagram of an input/output unit.

FIG. 3 is a circuit diagram of the input/output unit 21.

The output circuit 31 included in the input/output unit 21 is formed of an output buffer 31a and an ODT circuit 31b. In response to an output enable signal OEN supplied from the control circuit 36, the output buffer 31a outputs the data DQ read from the memory cell array 11 to the data input/output terminal DQP. Also, in response to an ODT enable signal ODTEN supplied from the control circuit 36, the ODT circuit 31b causes the data input/output terminal DQP to function as a termination resistor. However, it is not necessarily required to provide the output buffer 31a and the ODT circuit 31b separately, and a circuit for both functions may be used.

The input circuit 32 included in the input/output unit 21 receives data DQ inputted via the ESD protection diode 33, the input protection resistor 34, and the ESD protection diode 35. The input circuit 32 is activated in response to an input enable signal IEN supplied from the control circuit 36.

The ESD protection diodes 33, 35 each include a diode-connected P-channel-type MOS transistor and a diode-connected N-channel-type MOS transistor. With this structure, when large positive-voltage electrostatic noise is applied to the data input/output terminal DQP, the electrostatic noise is discharged via the P-channel-type MOS transistor to a power supply potential VDD. Also, when a large negative-voltage electrostatic noise is applied to the data input/output terminal DQP, the electrostatic noise is discharged via the N-channel-type MOS transistor to a ground potential VSS. Furthermore, the input protection resistor 34 inserted between the ESD protection diodes 33, 35 attenuates electrostatic noise and restricts its current value.

Figure 4:
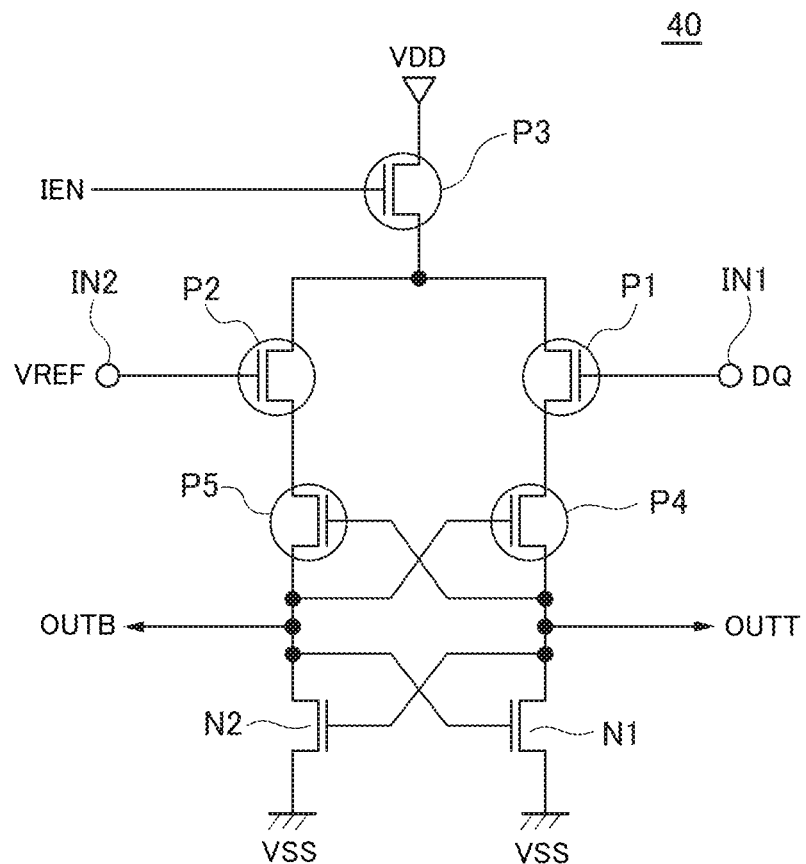
FIG. 4 is a circuit diagram of an amplifier included in an input circuit.

FIG. 4 is a circuit diagram of an amplifier 40 included in the input circuit 32.

The amplifier 40 includes paired P-channel-type MOS transistors P1, P2, a P-channel-type MOS transistor P3 connected to the sources of the transistors P1, P2, P-channel-type MOS transistors P4, P5 cross-coupled to the drains of the transistors P1, P2, and N-channel-type MOS transistors N1, N2 cross-coupled to the drains of the transistors P4, P5.

The transistors P1, P2 are input transistors, and have gate electrodes which represent a first input terminal IN1 and a second input terminal IN2, respectively. An input enable signal IEN is inputted to the gate electrode of the transistor P3, and the power supply voltage VDD is supplied to the source of the transistor P3. When the input enable signal IEN is activated to a low level, an operating current is supplied to the transistors P1, P2.

The transistors P4, P5, N1, N2 are configured as a flip-flop circuit. The operating current supplied to the transistors P4, N1 and the operating current supplied to the transistors P5, N2 change according to the level of the data DQ. As a result, when the level of the data DQ is higher than the reference voltage VREF, an output signal OUTT becomes a low level and an output signal OUTB becomes a high level. Conversely, when the level of the data DQ is lower than the reference voltage VREF, the output signal OUTT becomes a high level and the output signal OUTB becomes a low level. The output signals OUTT, OUTB are output signals from the amplifier 40.

Figure 5:
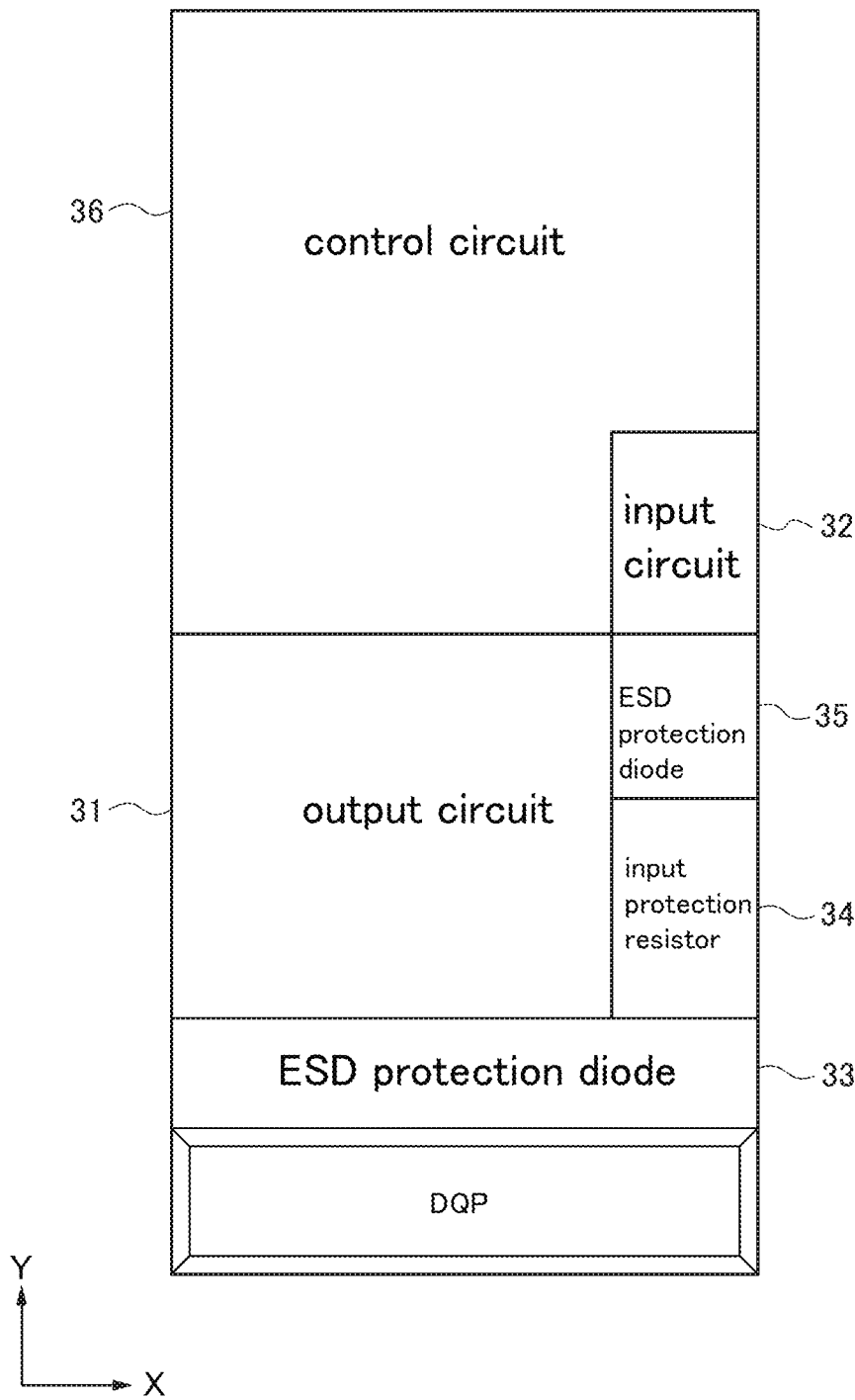
FIG. 5 is a layout diagram of an input/output unit in a prototype.

FIG. 5 is a layout diagram of an example input/output unit 21.

In the layout of the example, the ESD protection diode 33 is disposed on a Y direction side of the data input/output terminal DQP, and the output circuit 31 is disposed on a Y direction side of the ESD protection diode 33. Also, the input protection resistor 34 and the ESD protection diode 35 are disposed on an X direction side of the output circuit 31. A region where the output circuit 31, input protection resistor 34, and ESD protection diode 35 are formed has a shaped form.

Furthermore, the control circuit 36 is disposed on a Y direction side of the output circuit 31. Also, the input circuit 32 is disposed on a Y direction side of the ESD protection diode 35. A region where the control circuit 36 and the input circuit 32 are formed has a shaped form.

Figure 6:
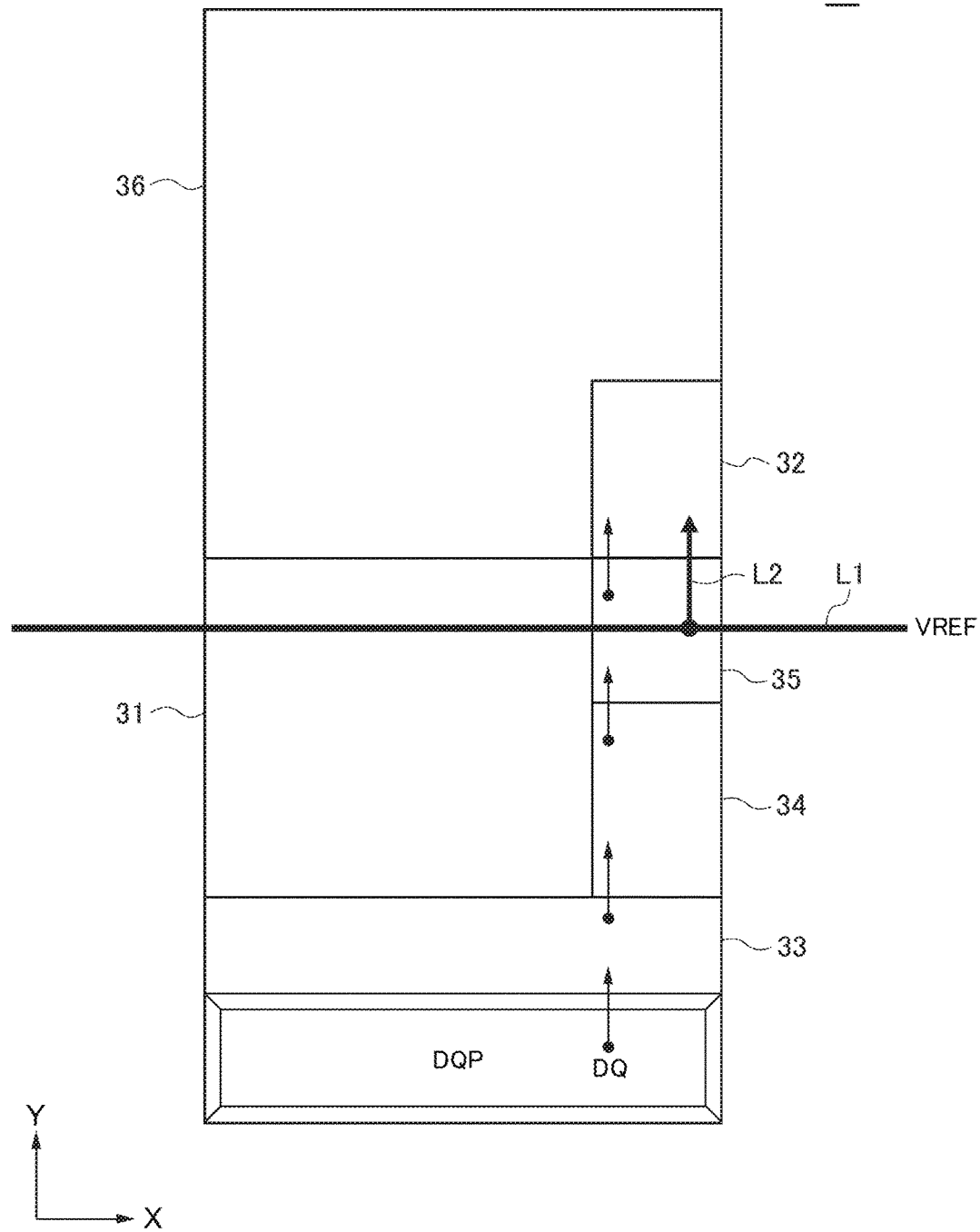
FIG. 6 is a schematic diagram for describing a flow of data and a reference voltage when the layout of the prototype is adopted.

FIG. 6 is a schematic diagram for describing a flow of data DQ and a reference voltage VREF for the layout of the example of FIG. 5.

As depicted in FIG. 6, the data DQ is supplied to the input circuit 32 via the data input/output terminal DQP, the ESD protection diode 33, the input protection resistor 34, and the ESD protection diode 35. As described above, the data DQ supplied to the input circuit 32 is inputted to the gate electrode of the transistor P1. On the other hand, the reference voltage VREF is supplied to the input circuit 32 via the power supply trunk line L1 and the power supply branch line L2. As described above, the reference voltage VREF supplied to the input circuit 32 is inputted to the gate electrode of the transistor P2.

Figure 7:
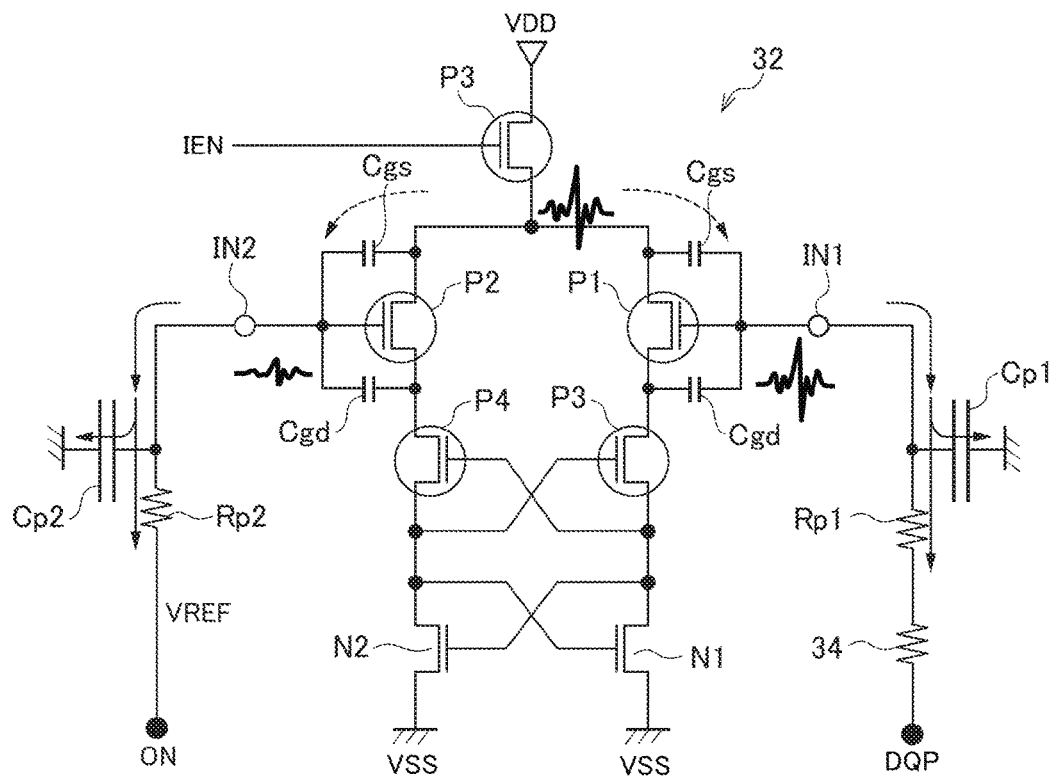
FIG. 7 is a diagram for describing propagation of noise occurring when an input enable signal is activated.

FIG. 7 is a diagram for describing propagation of noise occurring when the input enable signal IEN is activated.

When the input enable signal IEN is changed from a high level to a low level, the transistor P3 is changed from OFF to ON, thereby causing an operating current to start to flow to the input circuit 32 via the transistor P3. Thus, kickback noise transiently occurs, and this kickback noise is transferred to the transistors P1, P2. Since a gate-source capacitance Cgs and a gate-drain capacitance Cgd are present at the transistors P1, P2, the kickback noise is propagated via these capacitances Cgs, Cgd.

Then, the kickback noise propagated to the gate electrode of the transistor P1 further propagates to the ESD protection diode 35, the input protection resistor 34, and the ESD protection diode 33 toward the data input/output terminal DQP. The kickback noise propagated to the gate electrode of the transistor P2 further propagates to the power supply branch line L2 and the power supply trunk line L1 toward the output terminal ON of the reference voltage supply circuit 14.

In practice, however, since the resistance value of the input protection resistor 34 is relatively large under the environment around this resistor, most of the kickback noise propagated to the gate electrode of the transistor P1 is interrupted at the input protection resistor 34. Therefore, the kickback noise has a waveform according to the values of a parasitic capacitance Cp1 and a parasitic resistance Rp1 present on a wiring portion which connects the gate electrode of the transistor P1 and the input protection resistor 34 together. Here, on a transistor P1 side, the value of the parasitic capacitance Cp1 is small and the parasitic resistance Rp1 is large. Therefore, the kickback noise has a relatively large amplitude.

By contrast, since the power supply trunk line L1 for supplying the reference voltage VREF is a long-distance wire and is commonly connected to many input/output units 21 to 23, the value of a parasitic capacitance Cp2 is relatively large and the value of a parasitic resistance Rp2 is small. Therefore, on the transistor P2 side, the kickback noise is filtered, and its amplitude is relatively small.

As such, when the input enable signal IEN is activated, the level of the kickback noise appearing on the transistor P1 side and the level of the kickback noise appearing on the transistor P2 side have a difference, which is a factor in causing an input offset voltage. Moreover, electric charge in the parasitic capacitance Cp1 varies depending on whether the data DQ is at a high level or a low level. Therefore, the input offset voltage changes and also depends on the logic level of the data DQ.

Figure 8:
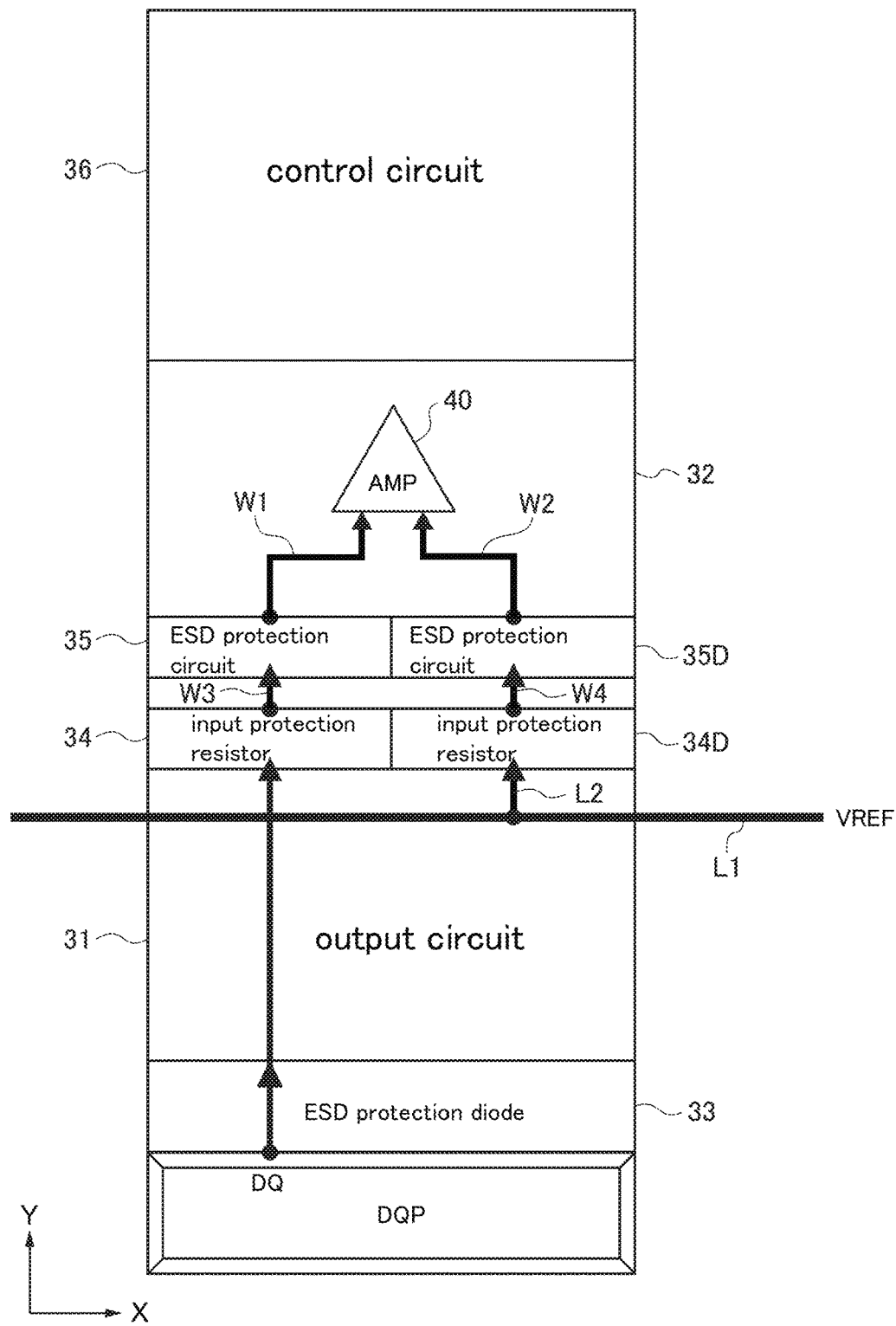
FIG. 8 is a layout diagram of an input/output unit according to a first embodiment.

FIG. 8 is a layout diagram of an input/output unit 21 according to a first embodiment.

In the first embodiment, from the data input/output terminal DQP to a Y direction side, ESD protection diode 33, the output circuit 31, input protection resistors 34, 34D, ESD protection diodes 35, 35D, the input circuit 32, and the control circuit 36 are disposed in this order. The input protection resistor 34D is a dummy circuit, and has a resistance value equal to that of the input protection resistor 34. The input protection resistors 34, 34D are disposed so as to be adjacent to each other in an X direction. Also, the ESD protection diode 35D is a dummy circuit, and has the same characteristics as those of the ESD protection diode 35. The ESD protection diode 35D has the same circuit configuration as the ESD protection diode 35. The ESD protection diodes 35, 35D are disposed so as to be adjacent to each other in the X direction.

As depicted in FIG. 8, the input protection resistor 34D is connected to a power supply branch line L2. The reference voltage VREF supplied to the input protection resistor 34D is supplied to the ESD protection diode 35D via a wire W4, and is further supplied to the amplifier 40 in the input circuit 32 via a wire W2. Data DQ supplied to the input protection resistor 34 is supplied to the ESD protection diode 35 via a wire W3, and is further supplied to the amplifier 40 in the input circuit 32 via a wire W1. As such, in the present embodiment, the circuit structure on a data DQ side is reproduced on a reference voltage VREF side.

Figure 9:
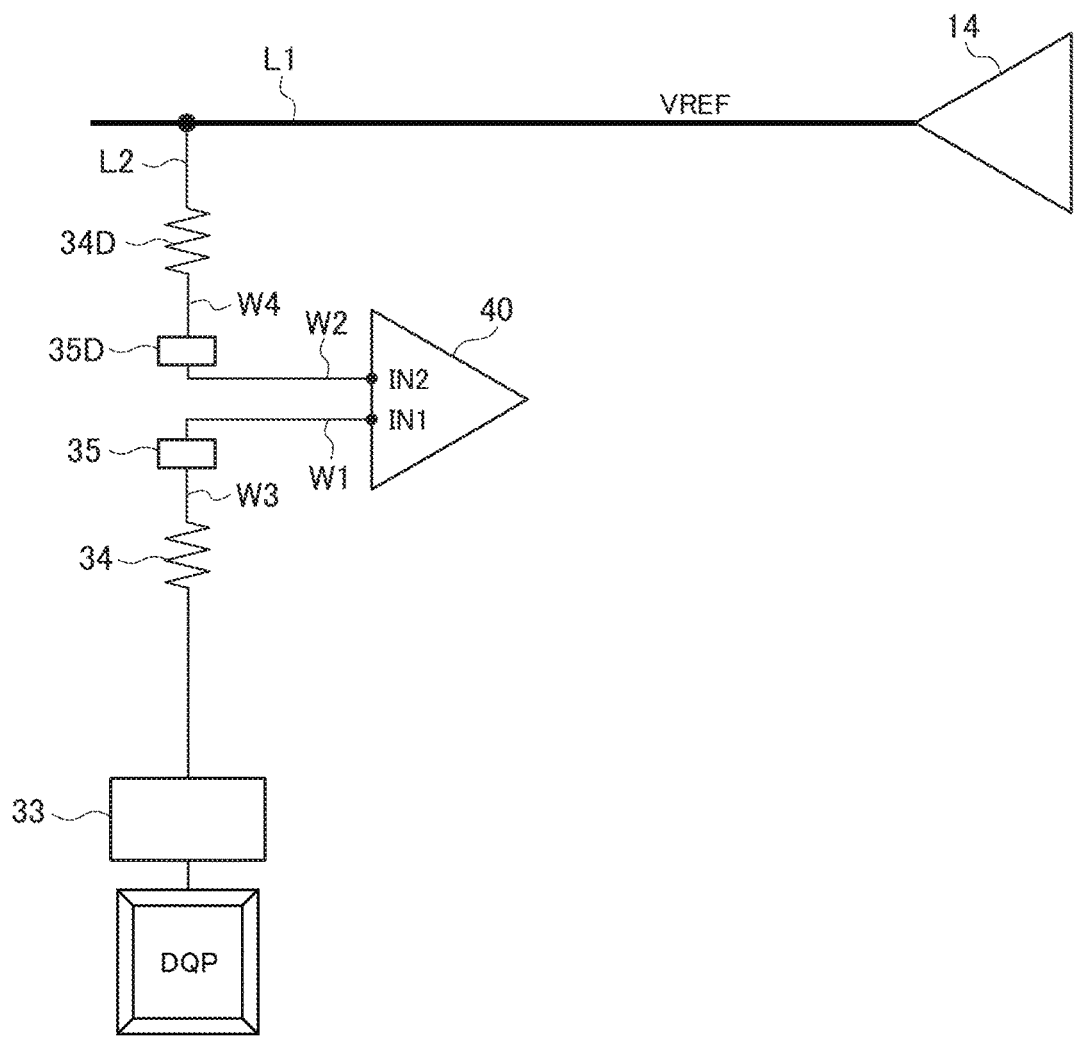
FIG. 9 is a circuit diagram of main parts of the input/output unit according to the first embodiment.

FIG. 9 is a circuit diagram of main parts of the input/output unit 21 according to the first embodiment.

As depicted in FIG. 9, in the present embodiment, the input protection resistor 34D and the ESD protection diode 35D are added. Therefore, the circuit structure between the first input terminal IN1 and the input protection resistor 34 approximately coincides with the circuit structure between the second input terminal IN2 and the input protection resistor 34D, and their resistance values and parasitic capacitance components coincide each other. To more accurately coincide both with each other, the resistance values of the input protection resistors 34, 34D are caused to coincide with each other, the circuit structures of the ESD protection diodes 35, 35D are caused to coincide with each other and, furthermore, the resistance values of the wires W1, W2 and the resistance values of the wires W3, W4 are caused to coincide with each other. Regarding the wires, the resistance values can be caused to coincide with each other by causing the wire widths and the lengths and number of contact conductors to coincide each other.

With this, kickback noise occurring by activation of the input enable signal IEN approximately uniformly propagates to transistor P1 side and P2 side. Therefore, an input offset voltage due to kickback noise is prevented from occurring.

Also in the present embodiment, the resistance value and parasitic capacitance of the data input/output terminal DQP viewed from the input protection resistor 34 and the resistance value and parasitic capacitance of the power supply branch line L2 viewed from the input protection resistance 34D have a large difference. However, since the resistance values of the input protection resistors 34, 34D are relatively large under the environment around these resistors, an input offset voltage due to a difference in circuit structure from the input protection resistors 34, 34D to the data input/output terminal DQP and the power supply branch line L2 rarely occurs in the amplifier 40.

Figure 10:
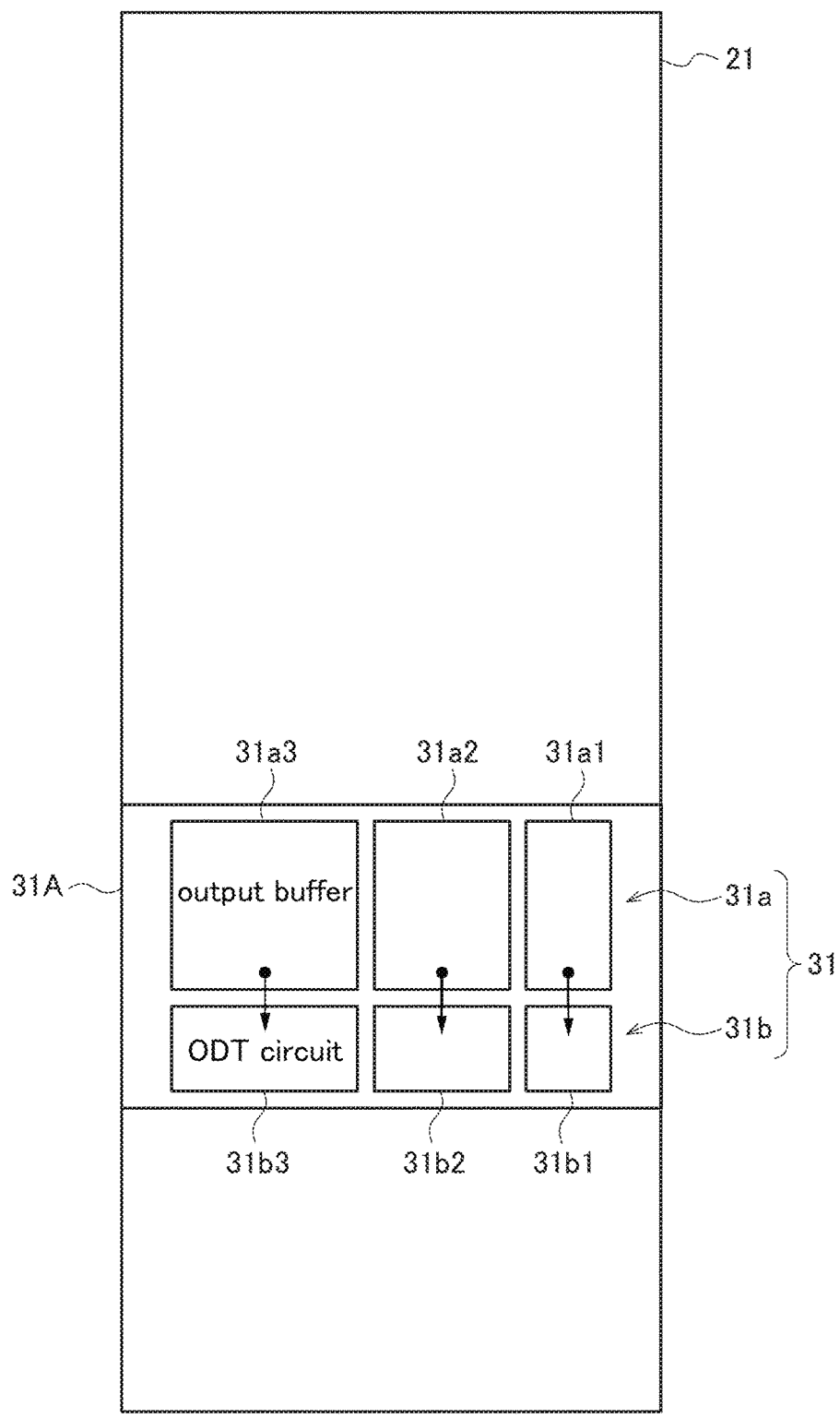
FIG. 10 is a block diagram depicting the structure of an output circuit.

FIG. 10 is a block diagram depicting the structure of the output circuit 31.

Figure 11:
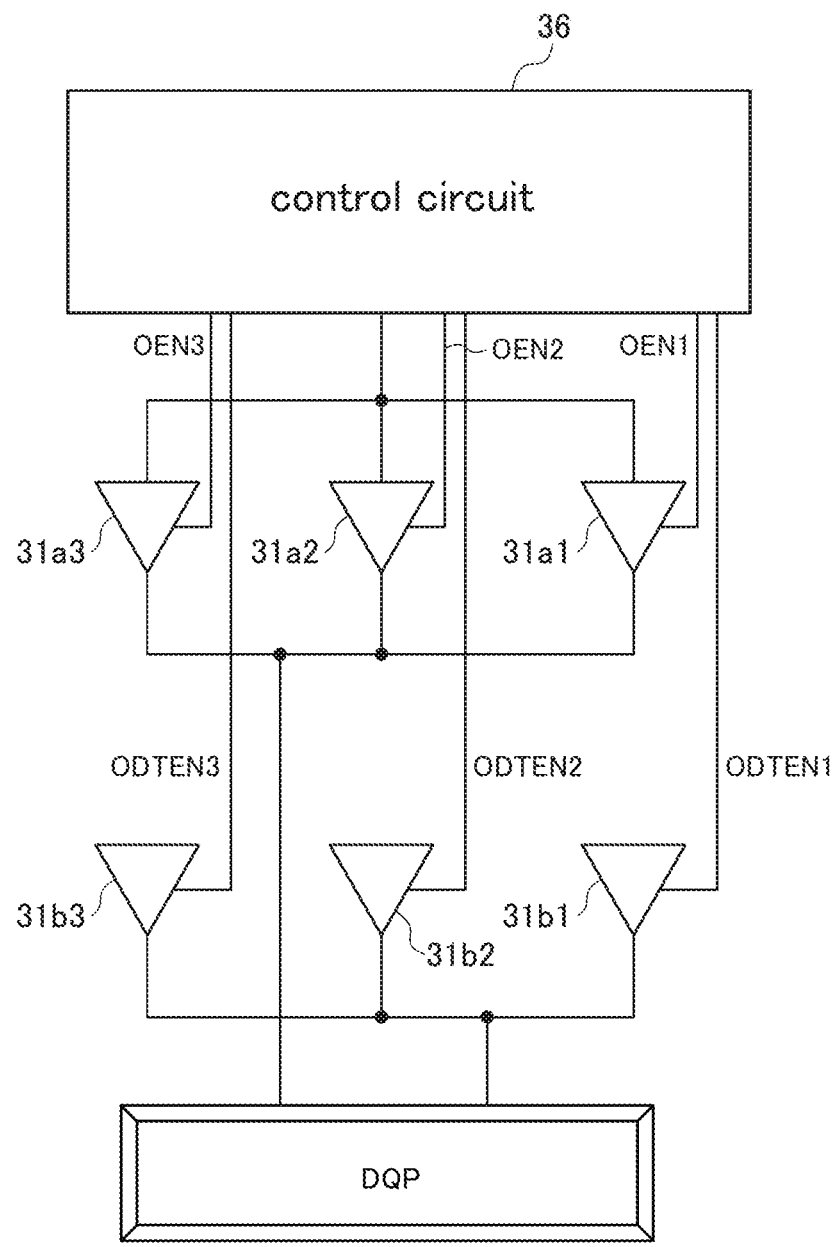
FIG. 11 is a circuit diagram depicting the structure of the output circuit.

The output circuit 31 includes an output buffer 31*a*, which is configured of three output buffers 31*a*1 to 31*a*3 different from each other in driving capability. For example, the output buffer 31*a*3 has a driving capability three times as high as that of the output buffer 31*a*1, and the output buffer 31*a*2 has a driving capability twice as high as that of the output buffer 31*a*1. As depicted in FIG. 11, these three output buffers 31*a*1 to 31*a*3 are activated with output enable signals OEN1 to OEN3, respectively, supplied from the control circuit 36. With this, the impedance of the data DO outputted from the data input/output terminal DQP can be switched at the time of read operation.

An ODT circuit 31*b* included in the output circuit 31 is configured of three ODT circuits 31*b*1 to 31*b*3 varied in driving capability. For example, the ODT circuit 31*b*3 has a driving capability three time as high as that of the ODT circuit 31*b*1, and the ODT circuit 31*b*2 has a driving capability twice as high as that of the ODT circuit 31*b*. As depicted in FIG. 11, these three ODT circuits 31*b*1 to 31*b*3 are activated with ODT enable signals ODTEN1 to ODTEN3, respectively supplied from the control circuit 36. With this, the termination resistance value of the data input/output terminal DQP can be switched at the time of ODT operation.

In the present embodiment, each circuit of the output circuit 31 is laid out in an output circuit region 31A according to a configuration of an embodiment of the invention. The output buffers 31a1 to 31a3 are arranged in an X direction, and the ODT circuits 31b1 to 31b3 are arranged in the X direction.

Figure 12:
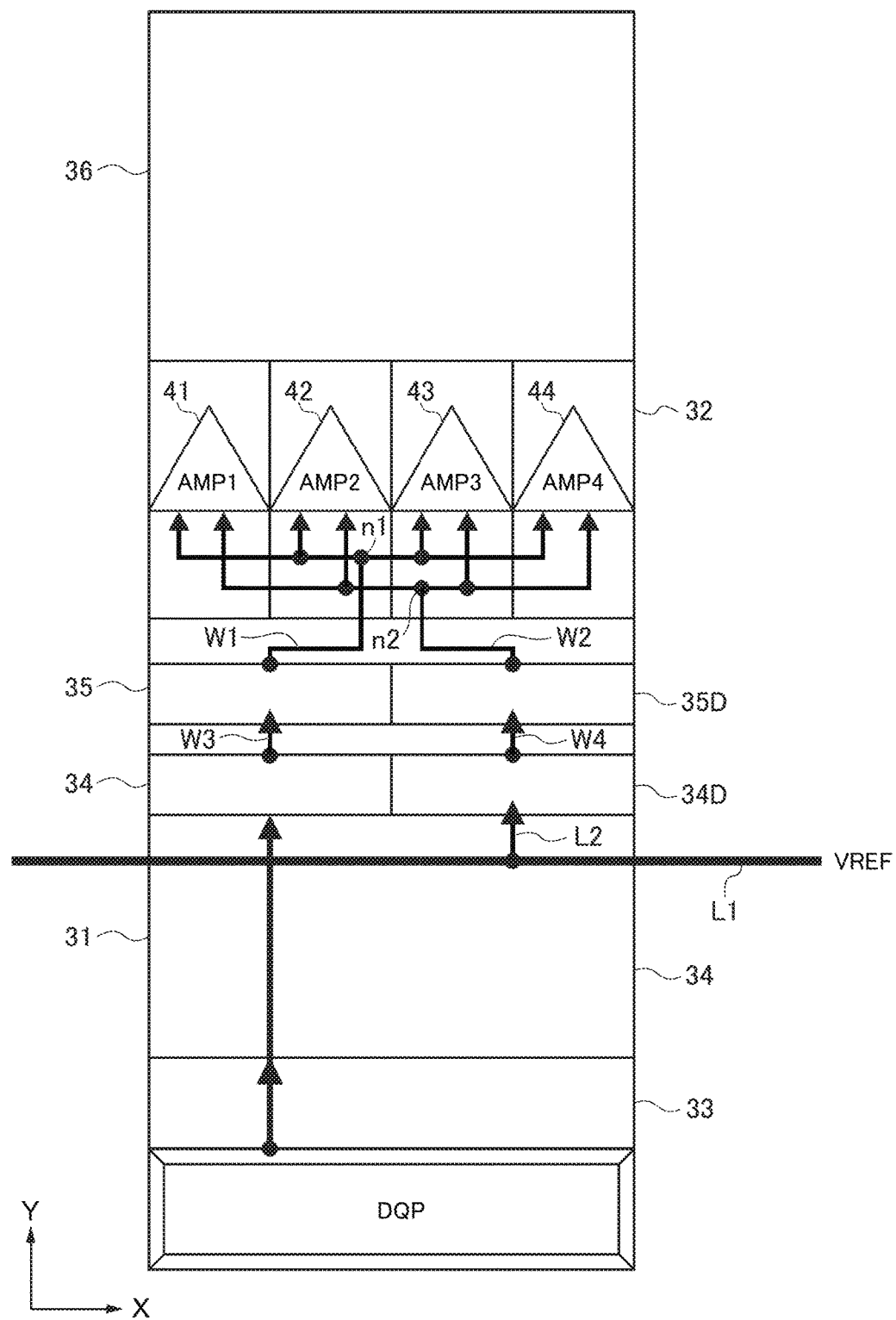
FIG. 12 is a layout diagram of an input/output unit according to a second embodiment.

FIG. 12 is a layout diagram of an input/output unit 21 according to a second embodiment.

In the second embodiment, the input circuit 32 includes four amplifiers 41 to 44. The circuit structures of the amplifiers 41 to 44 are identical to that of the amplifier 40 depicted in FIG. 7. The amplifiers 41 to 44 each have the first input terminal IN1 commonly connected to the ESD protection diode 35 via a node n1, and have the second input terminal IN2 commonly connected to the ESD protection diode 35D via a node n2. Since the other structures are identical to those of the first embodiment, a component in the second embodiment identical to that in the first embodiment is provided with the same reference character, and is not redundantly described herein.

Figure 13:
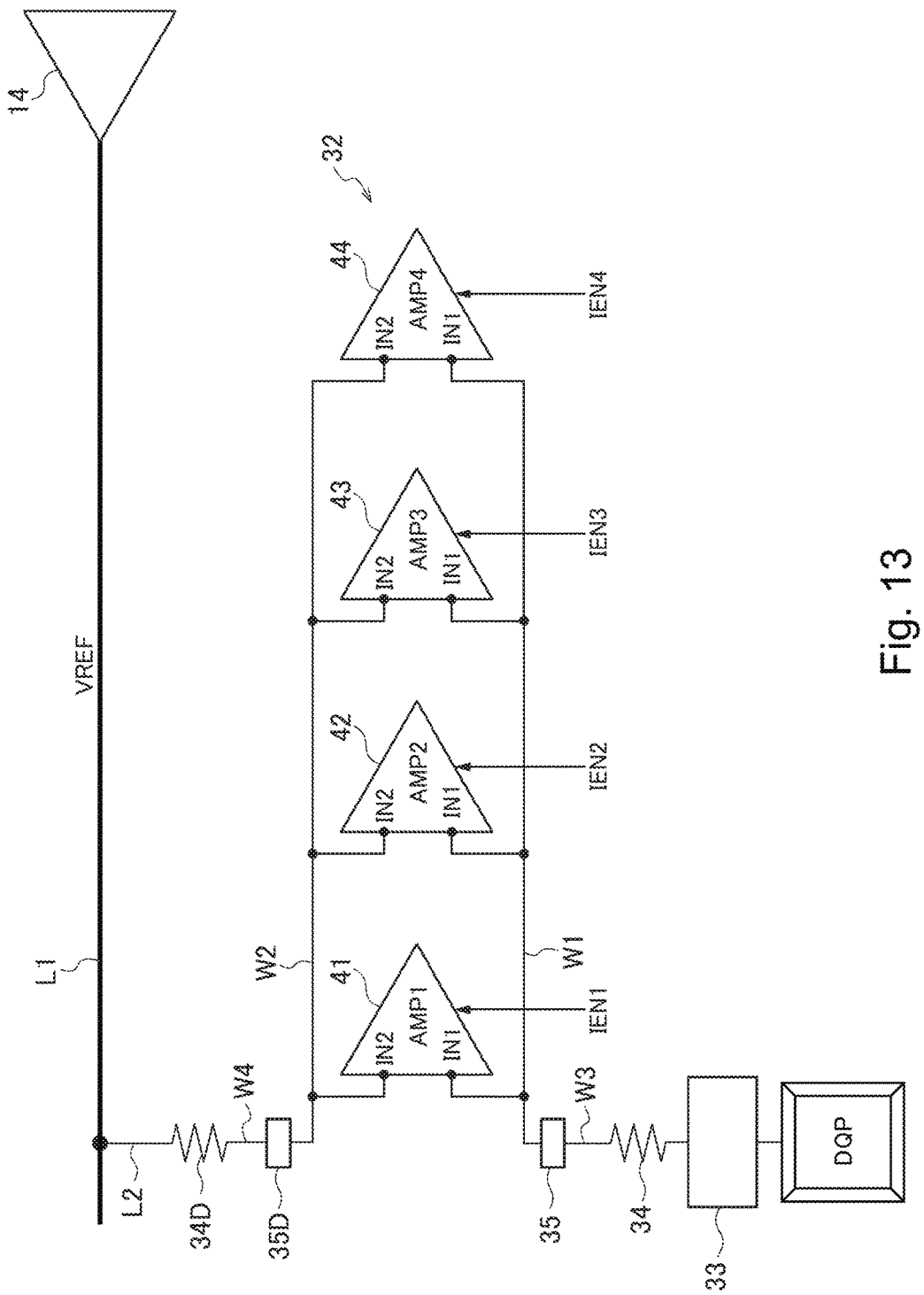
FIG. 13 is a circuit diagram of main parts of the input/output unit according to the second embodiment.

FIG. 13 is a circuit diagram of main parts of the input/output unit 21 according to the second embodiment.

In the second embodiment, the wire W1 is commonly connected to the first input terminals IN1 of the four amplifiers 41 to 44, and the wire W2 is commonly connected to the second input terminals IN2 of the four amplifiers 41 to 44. The resistance value of the wire W1 and the resistance value of the wire W2 coincide with each other. With this, an input offset voltage due to kickback noise is prevented.

Figure 14:
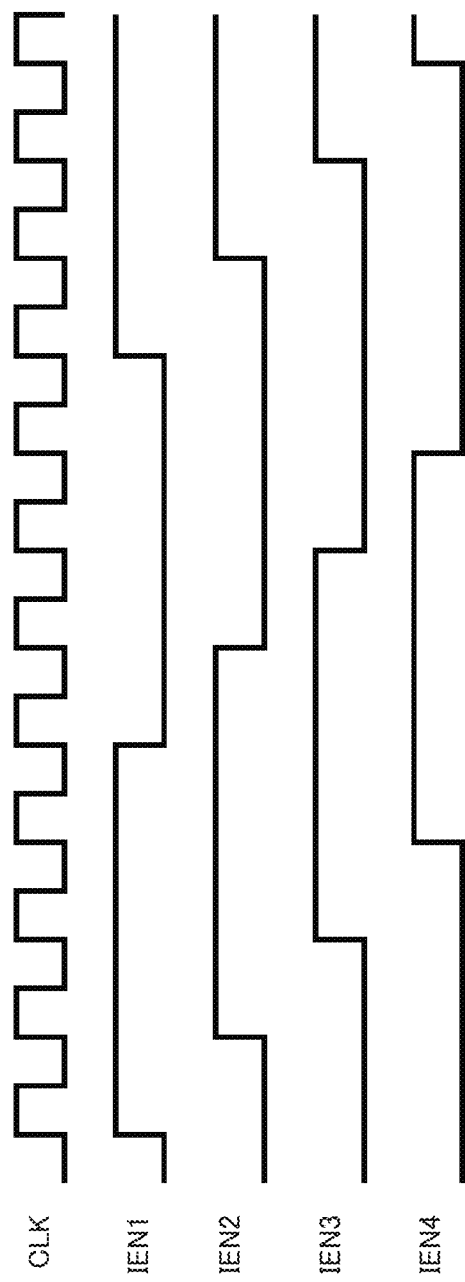
FIG. 14 is a waveform diagram of input enable signals.

The amplifiers 41 to 44 are activated with their corresponding input enable signals IEN1 to IEN4, respectively. As depicted in FIG. 14, the input enable signals IEN1 to IEN4 are signals varied in phase, and each have a cycle four times as long as a clock signal CLK. With this, data DQ serially inputted to the data input/output terminal DQP in synchronization with the clock signal CLK is sequentially taken into the amplifiers 41 to 44 in synchronization with the input enable signals IEN1 to IEN4 and outputted in parallel from the amplifiers 41 to 44. With this structure, even if the clock signal CLK has a high frequency, the data DQ can be correctly taken in at the time of write operation.

Figure 15:
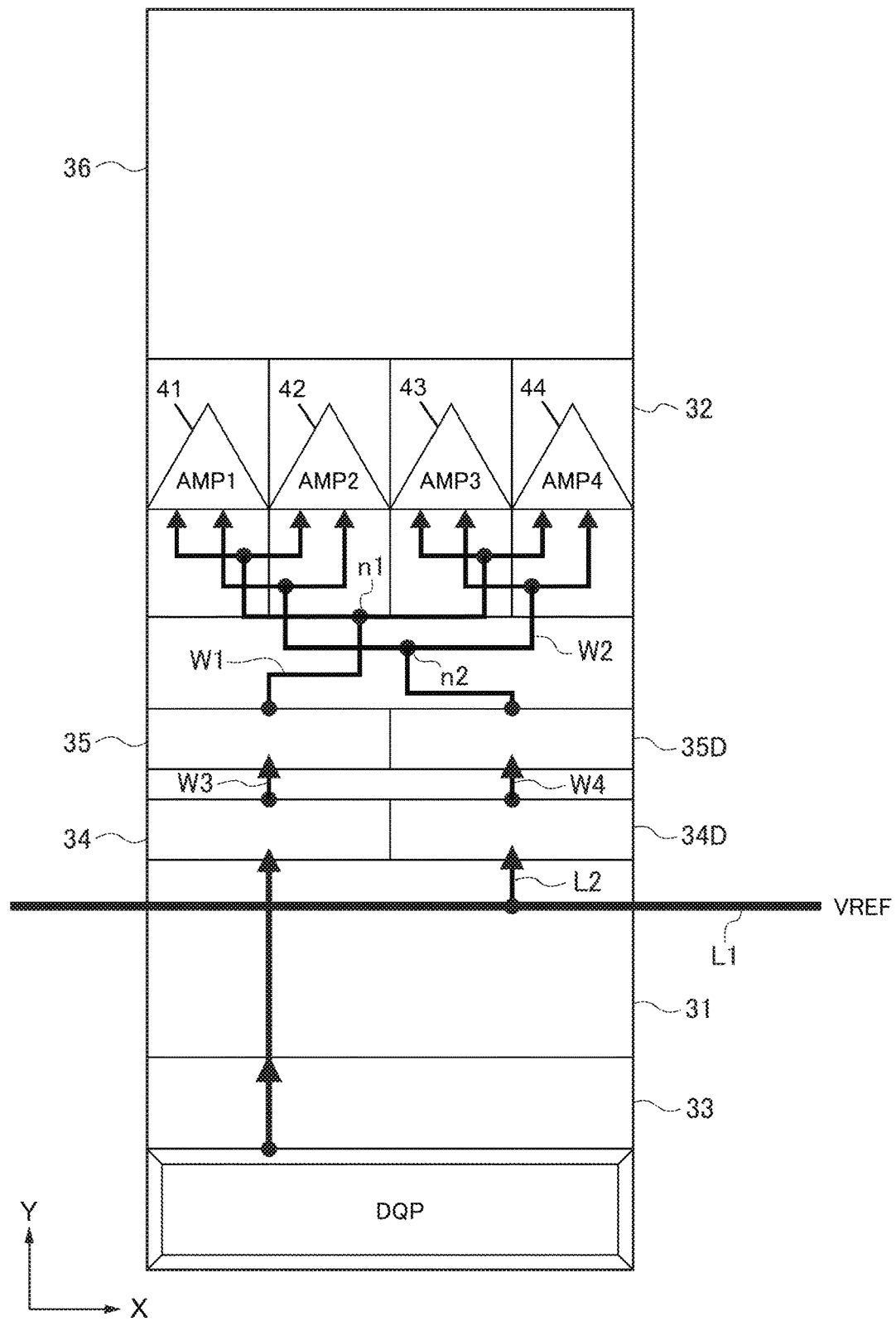
FIG. 15 is a layout diagram of an input/output unit according to a third embodiment.
Figure 16:
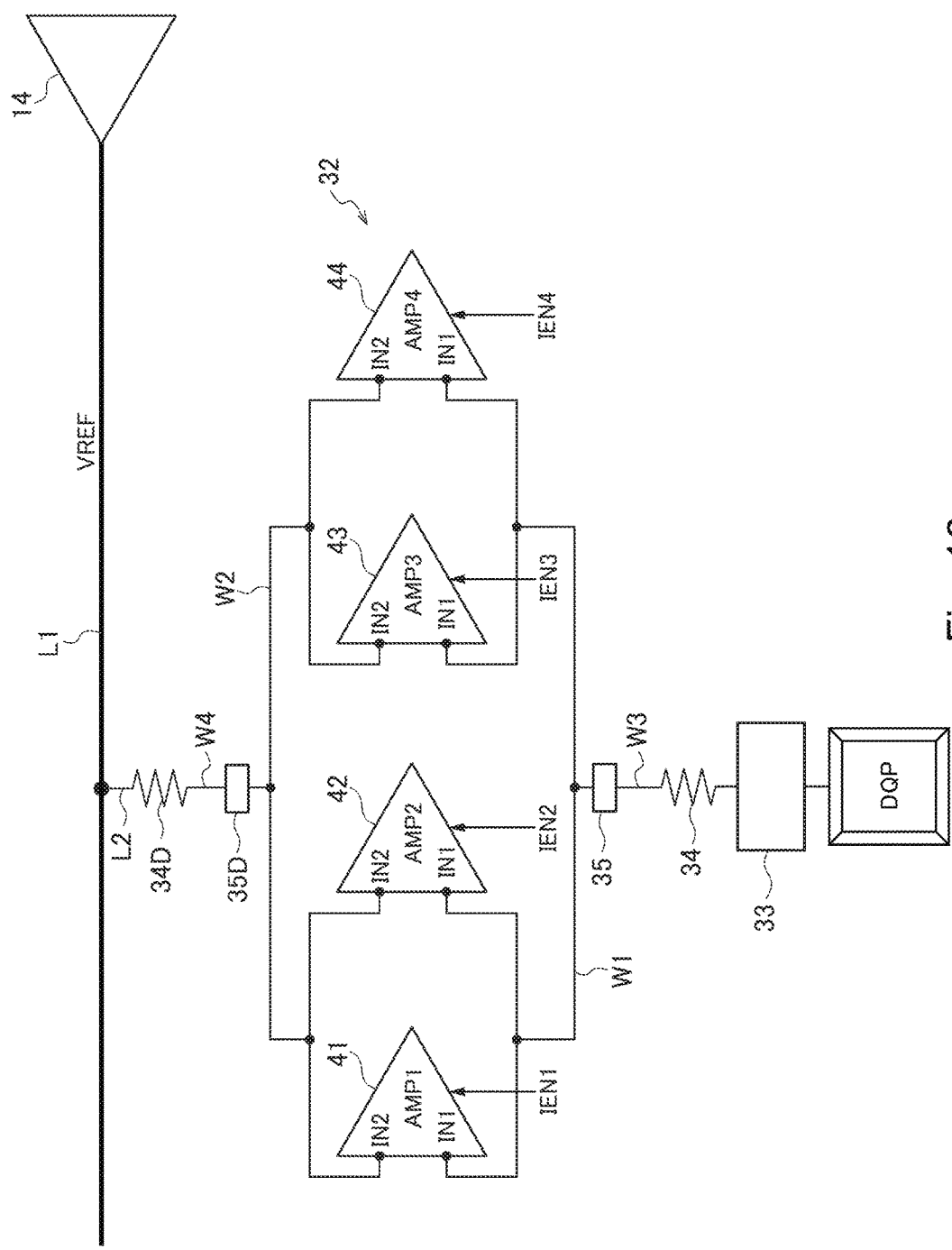
FIG. 16 is a circuit diagram of main parts of the input/output unit according to the third embodiment.

FIG. 15 is a layout diagram of an input/output unit 21 according to a third embodiment. FIG. 16 is a circuit diagram of main parts of the input/output unit 21 according to the third embodiment.

In the third embodiment, the wires W1 and W2 have a tree structure. The wire W1 is first branched into two from the node n1, and each branched wire W1 is further branched into two, thereby being connected to the first input terminal IN1 of each of the amplifiers 41 to 44. Similarly, the wire W2 is first branched into two from the node n2, and each branched wire W2 is further branched into two, thereby being connected to the second input terminal IN2 of each of the amplifiers 41 to 44. Since the other structures are identical to those of the second embodiment, a component in the third embodiment identical to that in the second embodiment is provided with the same reference character, and is not redundantly described herein.

Also in the third embodiment, if the resistance value of the wire W1 and the resistance value of the wire W2 are designed to coincide with each other, it is possible to prevent the occurrence of an input offset voltage due to kickback noise.

Figure 17:
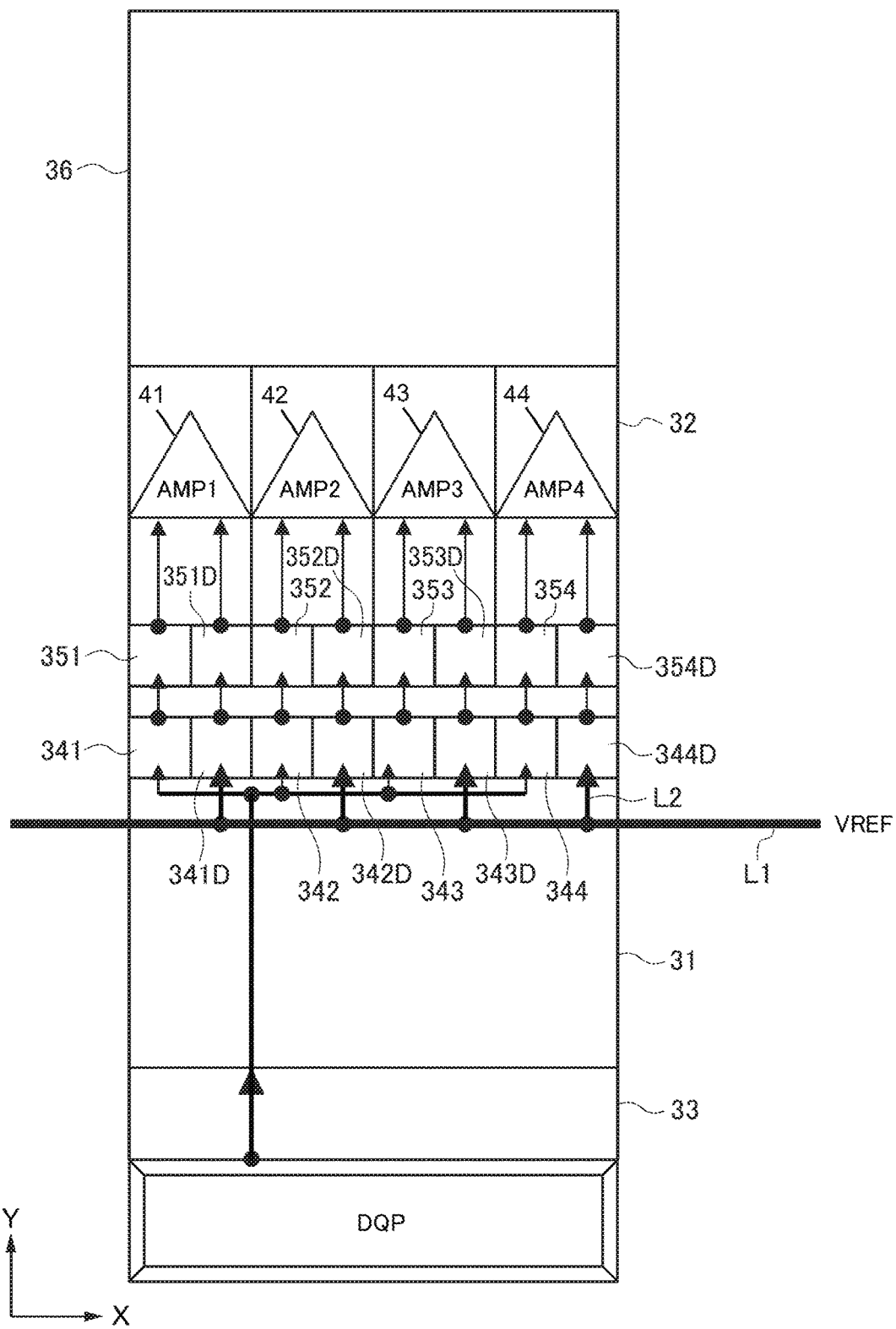
FIG. 17 is a layout diagram of an input/output unit according to a fourth embodiment.
Figure 18:
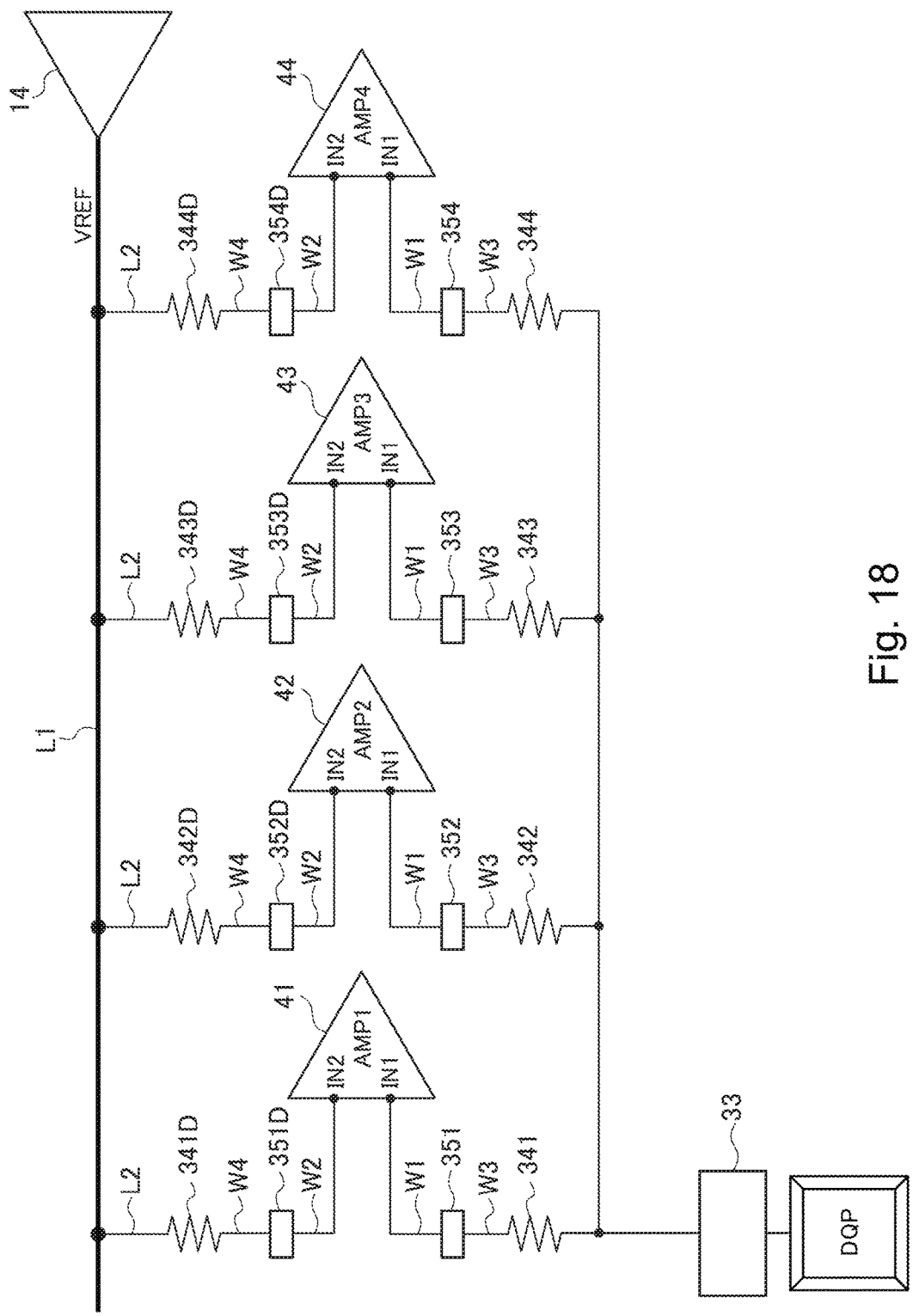
FIG. 18 is a circuit diagram of main parts of the input/output unit according to the fourth embodiment.

FIG. 17 is a layout diagram of an input/output unit 21 according to a fourth embodiment. FIG. 18 is a circuit diagram of main parts of the input/output unit 21 according to the fourth embodiment.

In the fourth embodiment, the input protection resistors 34, 34D and the ESD protection diodes 35, 35D are provided for each of the amplifiers 41 to 44. That is, the amplifier 41 is assigned with input protection resistors 341, 341D and ESD protection diodes 351, 351D; the amplifier 42 is assigned with input protection resistors 342, 342D and ESD protection diodes 352, 352D; the amplifier 43 is assigned with input protection resistors 343, 343D and ESD protection diodes 353, 353D; and the amplifier 44 is assigned with input protection resistors 344, 344D and ESD protection diodes 354, 354D. Accordingly, the power supply branch line L2 branched from the power supply trunk line L1 is also provided for each of the input protection resistors 341D to 344D. Since the other structures are identical to those of the second embodiment, a component in the fourth embodiment identical to that in the second embodiment is provided with the same reference character, and is not redundantly described herein.

Also in the fourth embodiment, if the resistance value of the wire W1 and the resistance value of the wire W2 are designed to coincide with each other, it is possible to prevent the occurrence of an input offset voltage due to kickback noise.

Figure 19:
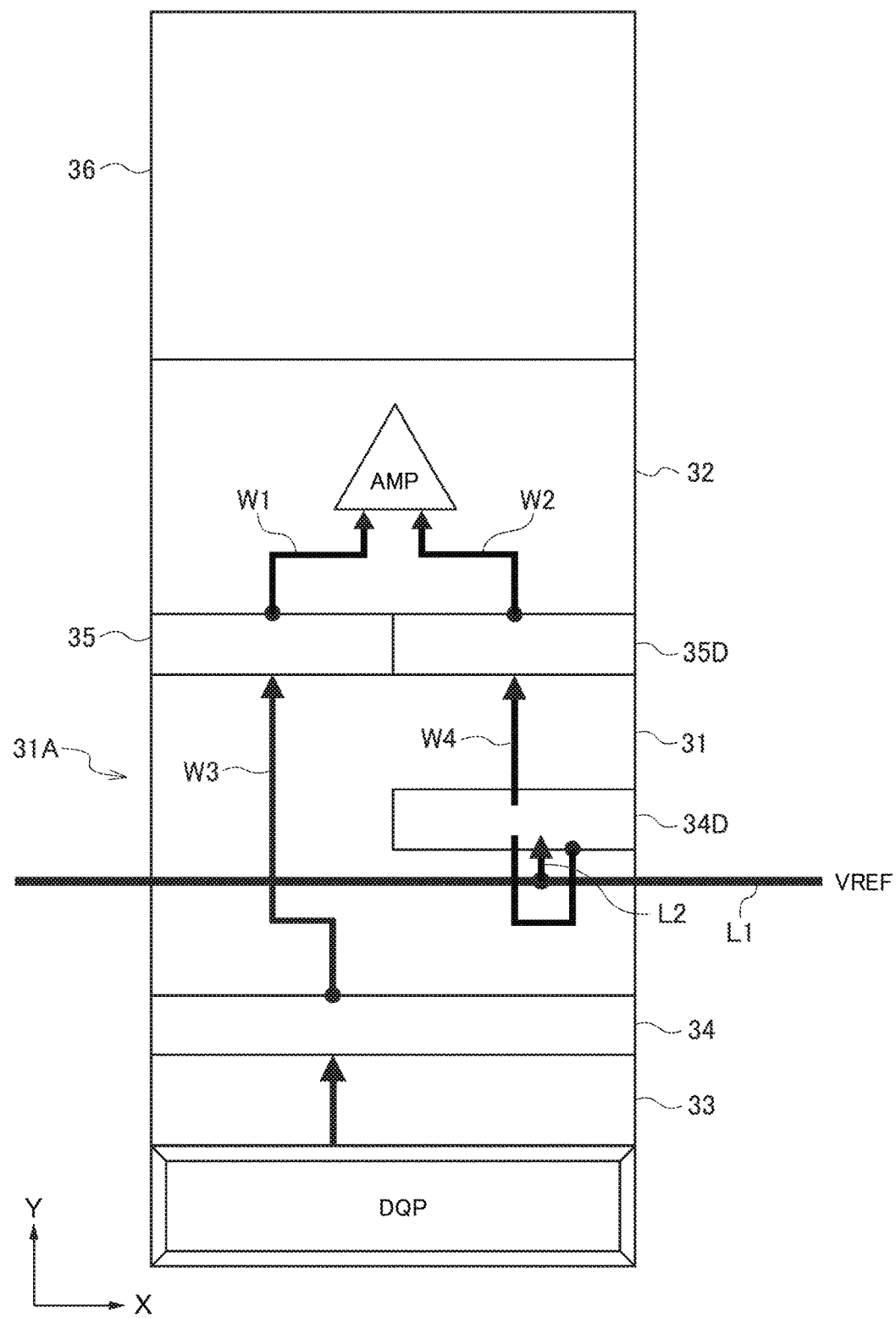
FIG. 19 is a layout diagram of an input/output unit according to a fifth embodiment.
Figure 20:
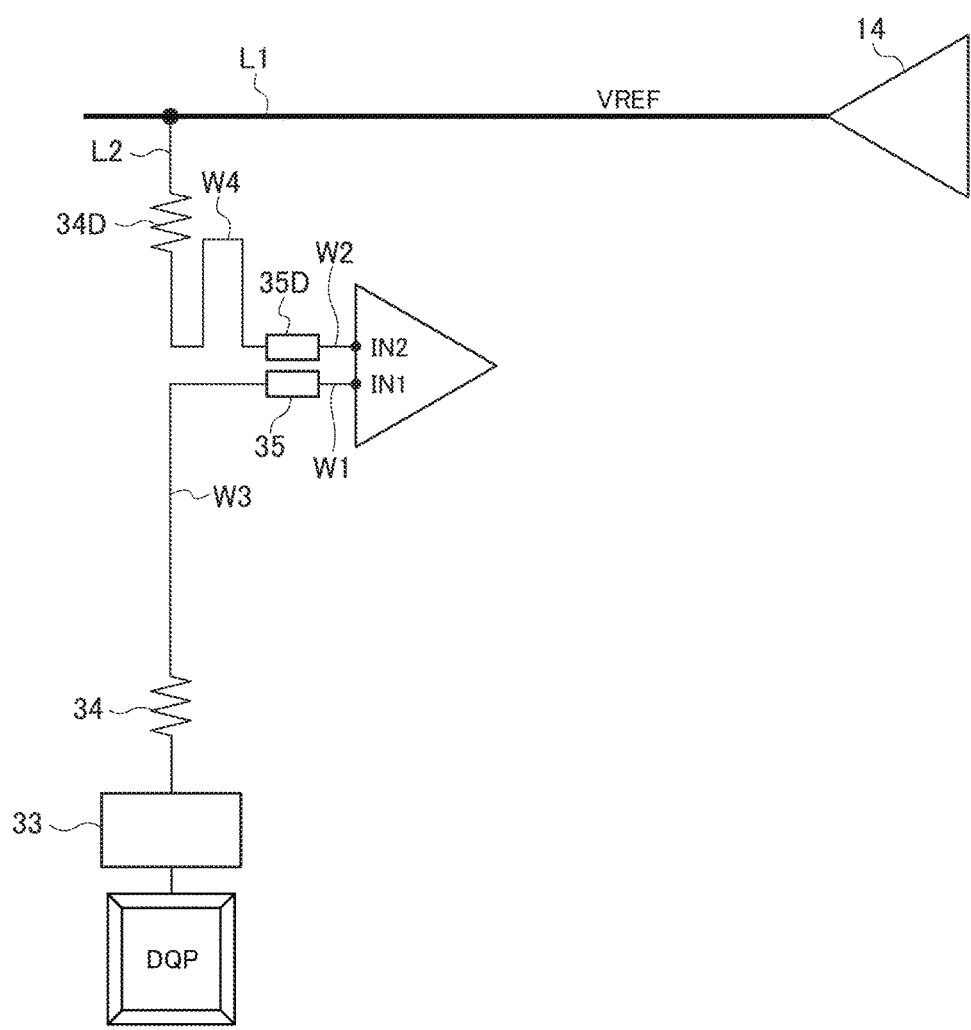
FIG. 20 is a circuit diagram of main parts of the input/output unit according to the fifth embodiment.

FIG. 19 is a layout diagram of an input/output unit 21 according to a fifth embodiment. FIG. 20 is a circuit diagram of main parts of the input/output unit 21 according to the fifth embodiment.

In the fifth embodiment, in order to reduce a terminal capacitance of the data input/output terminal DQP, the input protection resistor 34 is disposed near the data input/output terminal DQP. Therefore, the wire length of the wire W3 which connects the input protection resistor 34 and the ESD protection diode 35 together is longer than that of the first embodiment. On the other hand, the input protection resistor 34D is laid out in the output circuit region 31A where the output circuit 31 is disposed. As a result, when the input protection resistor 34D and the ESD protection diode 35D are connected together at a shortest distance, the length of the wire W4 is significantly shorter than that of the wire W3, causing a difference between their resistance values.

To address this problem, in the fifth embodiment, the wire W4 is detoured to cause the wire length of the wire W3 and the wire length of the wire W4 to coincide with each other. Since the other structures are identical to those of the first embodiment, a component in the fifth embodiment identical to that in the first embodiment is provided with the same reference character, and is not redundantly described herein.

The detour of the wire W4 can be made in the same wiring layer as that where the wire W3 is formed. However, if a wiring space is insufficient, the wire W4 may be routed to another wiring layer via a through hole conductor and then detoured in this wiring layer. In this case, however, the wire W3 is also desirably routed to another wiring layer to cause the numbers of through hole conductors for use to coincide with each other.

As such, in the fifth embodiment, the wire length of the wire W3 and the wire length of the wire W4 are caused to coincide with each other by detouring the wire W4. Therefore, it is possible to prevent an input offset voltage due to kickback noise.

As described by using FIG. 10, the output circuit region 31A has a layout according to an embodiment of the invention, and the output buffers 31a1 to 31a3 and the ODT circuits 31b1 to 31b3 are normally laid out as being aligned in the output circuit region 31A. However, as depicted in FIG. 19, in order to dispose the input protection resistor 34D in the output circuit region 31A, it is required to adjust the shape and position of each circuit configuring the output circuit 31.

Figure 21:
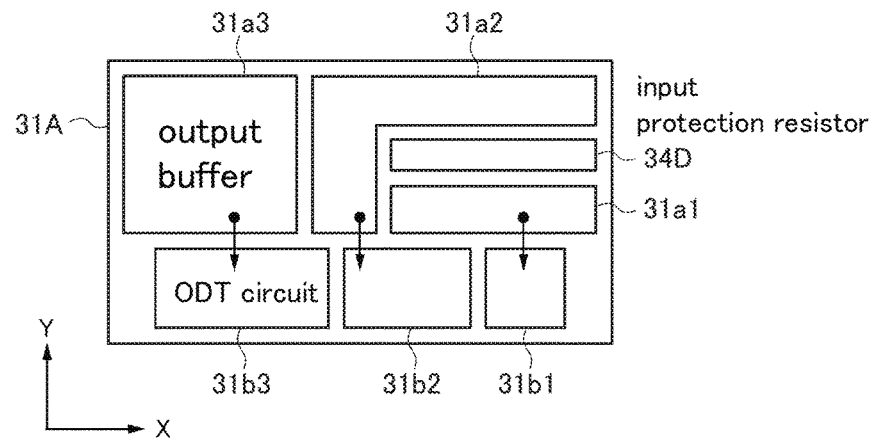
FIGS. 21A-21C are plan views of layouts of an output circuit region in the fifth embodiment.
Figure 21:
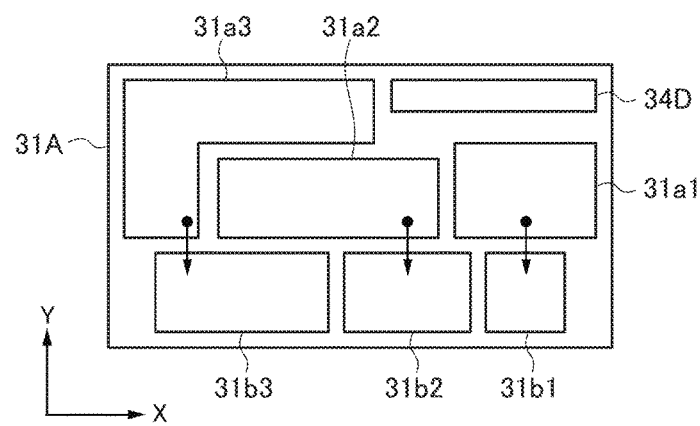
Figure 21:
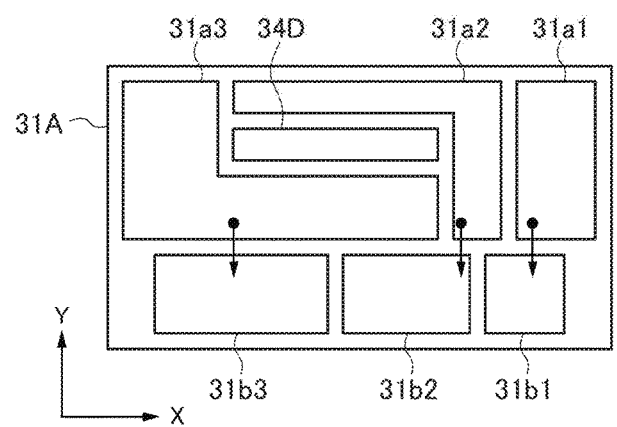

In this case, as depicted in FIG. 21A, a method includes deforming the output buffer 31a2 into an L shape, deforming the output buffer 31a1 into a horizontally-elongated shape (so that the X direction is a longitudinal direction), and disposing the input protection resistor 34D therebetween. Alternatively, as depicted in FIG. 21B, another method includes deforming the output buffer 31a3 into an L shape, deforming the output buffers 31a1, 31a2 into a horizontally-elongated shape (so that the X direction is a longitudinal direction), and disposing the input protection resistor 34D in a space caused by these deformations. Furthermore, as depicted in FIG. 21C, still another method includes deforming the output buffers 31a2, 31a3 into an L shape and disposing the input protection resistor 34D therebetween.

It is apparent that the present invention is not limited to the above embodiments, but may be modified and changed without departing from the scope and spirit of the invention.

What is claimed is:

1. A semiconductor device comprising:
   a terminal supplied with an input signal;
   an input circuit including a first input node and a second input node;
   a reference voltage circuit including an output node, the reference voltage circuit configured to produce a reference voltage at the output node; and
   a voltage line extending from the output node of the reference voltage circuit to convey the reference voltage;
   wherein the terminal, the input circuit, the reference voltage circuit and the voltage line are integrated on a single semiconductor substrate;
   wherein the input signal is supplied to the terminal from an outside of the single semiconductor substrate;
   wherein the semiconductor device further comprises:
      a protection circuit comprising a first resistor and a first diode coupled in series between the terminal and the first input node of the input circuit, the protection circuit being configured to protect the input circuit from electro-static discharge (ESD); and
      a dummy circuit comprising a second resistor and a second diode coupled in series between the voltage line and the second input node of the input circuit, a circuit configuration of the dummy circuit being substantially equivalent to a circuit configuration of the protection circuit; and
   wherein the protection circuit and the dummy circuit are integrated on the single semiconductor substrate.

2. The device of claim 1, wherein a resistance value of the first resistor is substantially equal to a resistance value of the second resistor.

3. The device of claim 1, further comprises an additional ESD diode coupled between the terminal and the protection circuit, the additional ESD diode being integrated on the single semiconductor substrate.

4. The device of claim 1, further comprising an output circuit configured to provide an output signal to the terminal, the output circuit being integrated on the single semiconductor substrate.

5. The device of claim 4, wherein the output circuit is between the terminal and the input circuit.

6. The device of claim 5,
   wherein the protection circuit is between the output circuit and the input circuit, and
   wherein the dummy circuit is between the output circuit and the input circuit.

7. The device of claim 6, further comprising a signal line extending from the terminal to the protection circuit beyond the output circuit to convey the input signal from the terminal to the protection circuit, the signal line being integrated on the single semiconductor substrate.

8. The device of claim 1, wherein the input circuit comprises a differential amplifier having a first input end coupled to the first input node and a second input end coupled to the second input node.

9. The device of claim 8, wherein the differential amplifier comprises:
   first and second transistors coupled in a differential form; and
   a third transistor coupled to serve as a current source for the first and second transistors.

10. The device of claim 9, wherein the third transistor is supplied with an enable signal, the differential amplifier being configured to be activated when the enable signal takes a first level and deactivated when the enable signal takes a second level.

11. The device of claim 1, wherein the protection circuit is coupled to the terminal but not the reference voltage circuit, and the dummy circuit is coupled to the reference voltage circuit but not the terminal.

12. A method comprising:
   supplying an input signal to a terminal, wherein the terminal is integrated on a single semiconductor substrate, wherein the input signal is supplied to the terminal from outside of the single semiconductor substrate;
   conveying the input signal from the terminal to a first input node of an input circuit through a protection circuit, wherein the input circuit and the protection circuit are integrated on the single semiconductor substrate, and wherein the protection circuit is configured to protect the input circuit from electro-static discharge;
   producing a reference voltage by a reference voltage circuit, wherein the reference voltage circuit is integrated on the single semiconductor substrate; and
   conveying the reference voltage from the reference voltage circuit to a second input node of the input circuit through a dummy circuit, wherein the dummy circuit is integrated on the single semiconductor substrate, and wherein a circuit configuration of the dummy circuit that receives the reference voltage from the reference voltage circuit is substantially equivalent to the protection circuit that receives the input signal from the terminal.

13. The method of claim 12, further comprising:
   providing an output signal by an output circuit, wherein the output circuit is integrated on the single semiconductor substrate; and
   conveying the output signal to the terminal.

14. The method of claim 13,
   wherein the output circuit is between the terminal and the input circuit; and
   wherein the conveying the input signal comprises transferring the input signal form the terminal to the input circuit beyond the output circuit.

15. The method of claim 12, wherein the protection circuit receives the input signal but not the reference voltage, and the dummy circuit receives the reference voltage but not the input signal.

16. An apparatus comprising:
   a data terminal receiving an input data signal in a data input mode and providing an output data signal in a data output mode;

an input circuit having a first input node and a second input node, wherein the input circuit is configured to receive the input data signal at the first input node;

an output circuit configured to produce and supply the output data signal to the data terminal, wherein the output circuit, the data terminal and the input circuit are arranged substantially in line in a first direction such that the output circuit is between the data terminal and the input circuit;

a reference voltage circuit configured to produce a reference voltage;

a voltage line coupled to the reference voltage circuit to receive the reference voltage, wherein the voltage line extends in a second direction to convey the reference voltage, and wherein the second direction crosses the first direction;

an electro-static discharge (ESD) protection circuit between the data terminal and the first input node of the input circuit, wherein the ESD protection circuit is configured to protect the input circuit from ESD; and a dummy circuit between the voltage line and the second input node of the input circuit, wherein the dummy circuit is substantially equivalent in circuit configuration to the ESD protection circuit, wherein the input circuit is coupled to the ESD protection circuit disposed between the data terminal and the first input node, and further coupled to the dummy circuit disposed between the reference voltage circuit and the second input node.

17. The apparatus of claim 16,
wherein the ESD protection circuit is between the output circuit and the input circuit in the first direction; and
wherein the dummy circuit is between the output circuit and the input circuit in the first direction.

18. The apparatus of claim 16, wherein the voltage line crosses over the output circuit in the second direction.

19. The apparatus of claim 16, further comprising an additional ESD protection diode coupled to the data terminal.

20. The apparatus of claim 16, wherein the data terminal, the input circuit, the output circuit, the reference voltage circuit, the voltage line, the ESD protection circuit and the dummy circuit are integrated on a single semiconductor substrate so that the input data signal is supplied to the data terminal from outside of the single semiconductor substrate and the output data signal is provided from the data terminal to outside of the single semiconductor substrate.

* * * * *